(12) United States Patent
Jakobsson

(10) Patent No.: US 6,757,340 B1
(45) Date of Patent: Jun. 29, 2004

(54) RADIO RECEIVER AND METHOD FOR PRELOADING AN AVERAGE DC-OFFSET INTO A CHANNEL FILTER

(75) Inventor: Jan Peter Jakobsson, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 09/255,576

(22) Filed: Feb. 22, 1999

(51) Int. Cl.[7] .............................................. H04L 25/06
(52) U.S. Cl. ..................... 375/319; 375/285; 375/350; 455/296
(58) Field of Search ................. 375/285, 317, 375/319, 346, 349, 350; 327/376; 455/278.1, 296, 311, 312, 313, 324; 370/345, 347

(56) References Cited

U.S. PATENT DOCUMENTS

| | | | |
|---|---|---|---|
| 4,873,702 A | 10/1989 | Chiu ........................... | 375/319 |
| 5,142,552 A | 8/1992 | Tzeng et al. ................. | 375/232 |
| 5,422,889 A | * 6/1995 | Sevenhans et al. .......... | 370/442 |
| 5,442,655 A | 8/1995 | Dedic et al. ................. | 375/340 |
| 5,612,975 A | * 3/1997 | Becker et al. ............... | 375/319 |
| 5,663,988 A | * 9/1997 | Neustadt ...................... | 375/319 |
| 5,724,653 A | 3/1998 | Baker et al. ................. | 455/296 |
| 5,754,595 A | 5/1998 | Honkasalo et al. .......... | 375/286 |

FOREIGN PATENT DOCUMENTS

| | | |
|---|---|---|
| EP | 0 840 484 | 5/1998 |
| JP | 10308684 | 11/1998 |

OTHER PUBLICATIONS

Standard EPO Search Report dated Oct. 18, 1999.

* cited by examiner

Primary Examiner—Chieh M. Fan
(74) Attorney, Agent, or Firm—Jenkens & Gilchrist, P. C.

(57) ABSTRACT

A radio receiver and method is provided that effectively compensates for an undesirable DC offset in a digital section of the radio receiver by preloading a filter with an average DC offset before filtering a signal within the filter. More specifically, the radio receiver includes an antenna for receiving a radio signal, and an analog section for demodulating the received radio signal into at least one baseband signal. The radio receiver also includes an analog-to-digital section for converting the at least one baseband signal into at least one digital baseband signal. The radio receiver further includes a preloading system for calculating an average DC offset using a predetermined number of symbols from the at least one digital baseband signal and for preloading a filter with the calculated average DC offset prior to filtering the at least one digital baseband signal in the filter.

23 Claims, 5 Drawing Sheets

Filter output without preload of DC-level

Filter output with preload (based on four samples) of the DC-level

RADIO RECEIVER AND METHOD FOR PRELOADING AN AVERAGE DC-OFFSET INTO A CHANNEL FILTER

BACKGROUND OF THE INVENTION

1. Technical Field of the Invention

The present invention generally relates to the wireless telecommunications field and, in particular, to a radio receiver and method for preloading a channel filter with an average DC offset before filtering a signal within the channel filter.

2. Description of Related Art

A mobile phone incorporates many components which can include a radio receiver configured as a homodyne receiver or heterodyne receiver. Unfortunately, the above-mentioned radio receivers generate an undesirable DC offset that adversely affects or increases a transient settling time in time division multiple access (TDMA) based communication systems. Transient settling time or start-up time is the length of time required within a filter to reduce the undesirable DC offset to an acceptable level before being able to output a desired signal from the radio receiver. The traditional solution used to reduce the transient settling time within the filter is to compensate for the undesirable DC offset by adding complex DC offset compensation circuitry to an analog section of the radio receiver.

An example of the traditional radio receiver incorporating the complex analog DC offset compensation circuitry is briefly discussed below and disclosed in Baker et al. U.S. Pat. No. 5,724,653.

Referring to FIG. 1 (PRIOR ART), there is illustrated a block diagram of the traditional radio receiver 100 incorporating complex analog DC offset compensation circuitry 102 described in the '653 patent. The general architecture of the radio receiver 100 (e.g., heterodyne receiver) is well known in the industry and as such is not described in great detail herein.

Basically, the traditional radio receiver 100 includes an antenna 104 for receiving an input radio signal from a transmitter 106. The received input radio signal is amplified through a low noise amplifier 108 and coupled to a first mixer 110, via a first switch 112. The first mixer 110 connects to a first local oscillator 114 by way of a second switch 116 and outputs an intermediate frequency (IF) signal 117 related to the received input radio signal. The first switch 112 and the second switch 116 include some of the components associated with the DC offset compensation circuitry 102.

The IF signal 117 is filtered by a bandpass filter 118 coupled to the first mixer 110, and amplified by a variable gain amplifier 120 coupled in series with the bandpass filter. A capacitor 122 couples the variable gain amplifier 120 to a demodulation circuit configured to demodulate the IF signal 117 into a baseband inphase (I) signal 124 and a baseband quadrature (Q) signal 126. More specifically, the demodulation circuit includes a second local oscillator 128 connected to a second mixer 130, third mixer 132 and phase shifter 133 that collectively operate to convert the IF signal 117 into the baseband I signal 124 and the baseband Q signal 126, reactively.

The demodulation circuit further includes a first DC correction circuit 134 and a second DC correction circuit 136 representing the remaining components of -the DC offset compensation circuitry 102. The first and second DC correction circuits 134 and 136 each include a low pass filter 138 for reducing noise bandwidth and filtering erroneous samples associated with the baseband I signal 124 and the baseband Q signal 126.

The DC offset compensation circuitry 102 is configured such that each of the first and second DC correction circuits 134 and 136 are adapted to store a DC offset prior to the received input radio signal being coupled into the first mixer 110. In other words, the first and second switches 112 and 116 are opened to prevent the received input radio signal from entering the first mixer 110 when the DC offsets are being stored in the first and second DC correction circuits 134 and 136.

Thereafter, each of the first and second DC correction circuits 134 and 136 operate to subtract the stored DC offset from the corresponding baseband I signal 124 and baseband Q signal 126 received upon closing the first and second switches 112 and 116. The baseband I signal 124 and baseband Q signal 126 are then amplified by respective amplifiers 140 and converted to digital baseband signals by respective analog-to-digital (A/D) convertors 142. The digital baseband signals are filtered by digital filters 144 and then digitally demodulated by a digital demodulator 146 to output a desired signal 148. of course, the timing required to open and close the first and second switches 112 and 116 combined with the operations of storing and subtracting of the DC offsets by the first and second DC correction circuits 134 and 136 of the traditional radio receiver 100 is a complex way to compensate for DC offsets. Accordingly, there is a need for a radio receiver and method that effectively compensates for undesirable DC offsets in a less complex manner.

BRIEF DESCRIPTION OF THE INVENTION

The present invention is A method and radio receiver that effectively compensates for an undesirable DC offset in a digital section of the radio receiver by preloading a filter with an average DC offset before routing a signal through the filter. More specifically, the radio receiver includes an antenna for receiving a radio signal, and an analog section for demodulating the received radio signal into at least one baseband signal. The radio receiver also includes an analog-to-digital section for converting the at least one baseband signal into at least one digital baseband signal. The radio receiver further, includes a preloading system for calculating an average DC offset using a predetermined number of symbols from the at least one digital baseband signals and for preloading a filter with the calculated average DC offset prior to filtering the at least one digital baseband signal in the filter.

In accordance with the present invention, there is provided a method and radio receiver that reduces the current consumption of the radio receiver.

Also in accordance with the present invention, there is provided a method and radio receiver that reduces a transient settling time in a filter.

Further in accordance with the present invention, there is provided a method and radio receiver that effectively suppresses interference attributable to a filter in an adjacent timeslot.

BRIEF DESCRIPTION OF THE DRAWINGS

A more complete understanding of the method and apparatus of the present invention may be had by reference to the following detailed description when taken in conjunction with the accompanying drawings wherein.

DETAILED DESCRIPTION OF THE DRAWINGS

Figure 1:
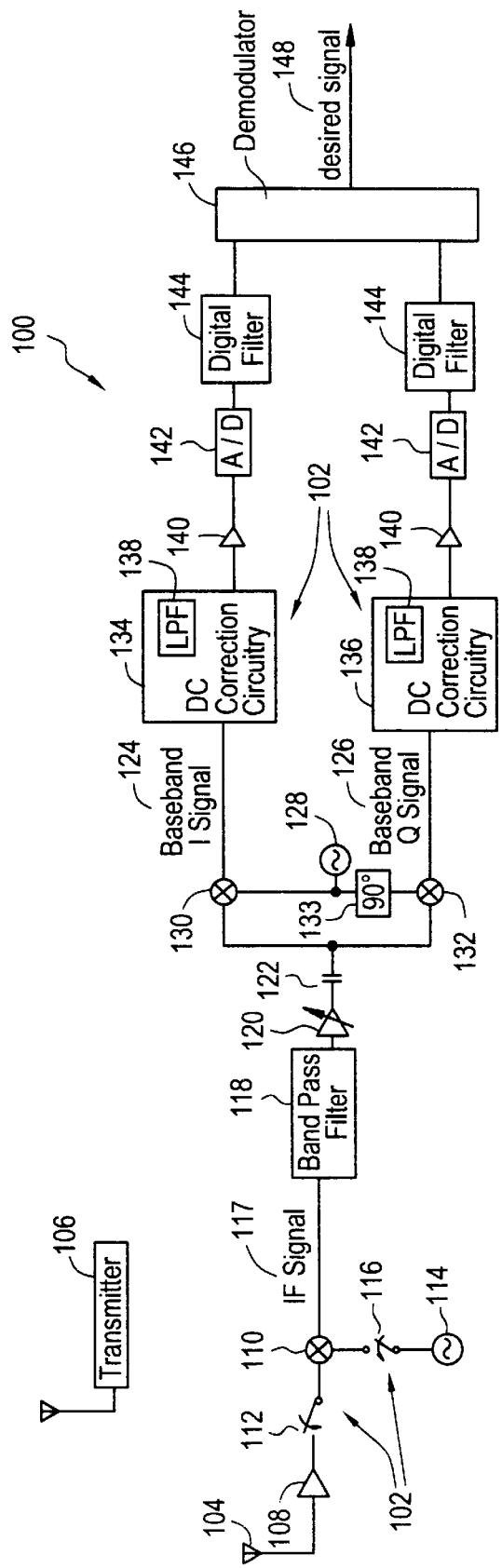
FIG. 1 (PRIOR ART) is a block diagram of a traditional radio receiver incorporating complex analog DC offset compensation circuitry.

Referring to the Drawings, wherein like numerals represent like parts throughout FIGS. 2–5, there are disclosed an exemplary radio receiver 200 and preferred method 300 that compensates for an undesirable DC offset by preloading a filter with an average DC offset before routing a signal through the filter in accordance with the present invention.

Although the radio receiver 200 will be described with reference to a receiver configured as a heterodyne receiver, it should be understood that the present invention can be used within a receiver configured as a homodyne receiver or any type of receiver in which signals are converted to baseband signals. Accordingly, the radio receiver 200 described should not be construed in such a limited manner.

Figure 2:
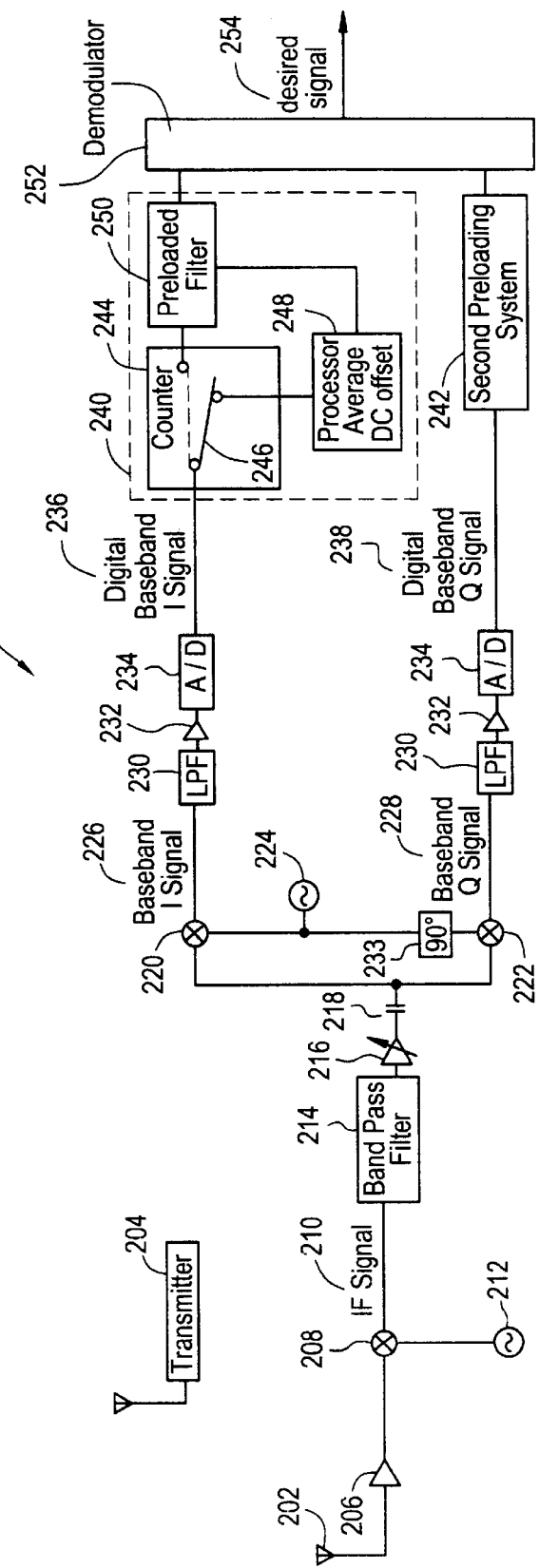
FIG. 2 is a block diagram of a radio receiver in accordance with the present invention that compensates for an undesirable DC offset by preloading a filter with an average DC offset before filtering a signal.

Referring to FIG. 2, there is illustrated the radio receiver 200 of the present invention. Certain details associated with the radio receiver 200 are known in the industry and as such need not be described herein. Therefore, for clarity, the description provided below in relation to the radio receiver 200 and the preferred method 300 omits some components not necessary to understand the invention.

Generally, the radio receiver 200 operates to calculate an average DC offset using a predetermined number of symbols from a digital baseband signal. And, then the radio receiver 200 operates to preload a filter with the calculated average DC offset prior to filtering the digital baseband signal within the filter to compensate for an undesirable DC offset. A detailed description of the preferred method 300 as to how the average DC offset is calculated and preloaded in the filter is deferred pending a discussion of the architecture of the radio receiver 200.

The radio receiver 200 includes an antenna 202 for receiving an input radio signal from a transmitter 204. The received input radio signal is amplified through a low noise amplifier 206 and coupled to a first mixer 208. The first mixer 208 outputs an intermediate frequency (IF) signal 210 using the received input radio signal and a first local oscillator 212.

The IF signal 210 is filtered by a bandpass filter 214 coupled to the first mixer 208, and amplified by a variable gain amplifier 216 coupled in series with the bandpass filter. A capacitor 218 couples the variable gain amplifier 216 to a second mixer 220 and third mixer 222. The second mixer 220 connects to a second local oscillator 224, and the third mixer 222 connects to the second local oscillator 224 via a phase shifter 223. The second local oscillator 224 coupled with the phase shifter 223, second mixer 220 and third mixer 222 collectively operate to convert the IF signal 210 into a baseband I signal 226 and a baseband Q signal 228, respectively. The baseband I signal 226 and baseband Q signal 228 each include an AC component containing a desired signal and an undesirable DC offset. The DC offset is a fundamental problem within receivers and is generally caused by mixer(s) and analog circuitry used to produce or process the baseband I signal 226 and baseband Q signal 228.

The second and third mixers 220 and 222 are coupled to a corresponding low pass filter 230 which functions to reduce noise bandwidth and filter erroneous samples associated with the baseband I signal 226 and the baseband Q signal 228, respectively. Each low pass filter 230 connects to an amplifier 232 coupled to a corresponding A/D convertor 234 that converts the baseband I signal 226 and the baseband Q signal 228 into a digital baseband I signal 236 and a digital baseband Q signal 238, respectively.

The digital baseband I signal 236 and the digital baseband Q signal 238 are input to a first preloading system 240 and a second preloading system 242, respectively. To avoid repetition, only the first preloading system 240 is described since the second preloading system 242 and the first preloading system 240 have the same architecture and functionality.

The first preloading system 240 includes a counter 244 that selectively controls a switch 246 (solid line) to direct a predetermined number of symbols from the digital baseband I signal 236 to a processor 248. The predetermined number of symbols can be any number of symbols including one, two, four or higher depending on the needed suppression of a transient signal caused by the undesirable DC offset. Suppressing the transient signal in effect leads to a reduction of the transient settling time or start-up time of a channel filter 250, where the transient settling time is the length of time required by the channel filter 250 to reduce the undesirable DC offset to an acceptable level.

To suppress the transient signal, the processor 248 calculates an average DC offset using the predetermined number of symbols from the digital baseband I signal 236. After calculating the average DC offset, the processor 248 preloads or presets the channel filter 250 with the calculated average DC-offset before the counter 244 directs the switch 246 (dashed lines) to couple the remaining digital baseband I signal 238 to the channel filter. The remaining digital baseband I signal 238 is then filtered by the channel filter 250 and digitally demodulated by a digital demodulator 252 to output a desired signal 254.

The channel filter 250 can be, for example, a digital filter configured as a finite impulse response (FIR) filter. The channel filter 250, when configured as the FIR filter, has a transfer function that includes only zeros such that the transient settling time is equal to the filter length and dependent upon the bandwidth and roll-off of the FIR filter. As a result, the transient signal resulting from a shift in the DC level or DC offset is effectively canceled out (see FIG. 5) by preloading the calculated average DC offset into the channel filter 250.

It should be understood that preloading the channel filter 250 with the calculated average DC offset effectively eliminates the need to prematurely start the channel filter during an adjacent timeslot, so the channel filter 250 need not be affected by power from the adjacent timeslot. Because, the transient signal is reduced and the filter need not be started during an adjacent time slot, the power consumption of the filter is reduced.

Figure 3:
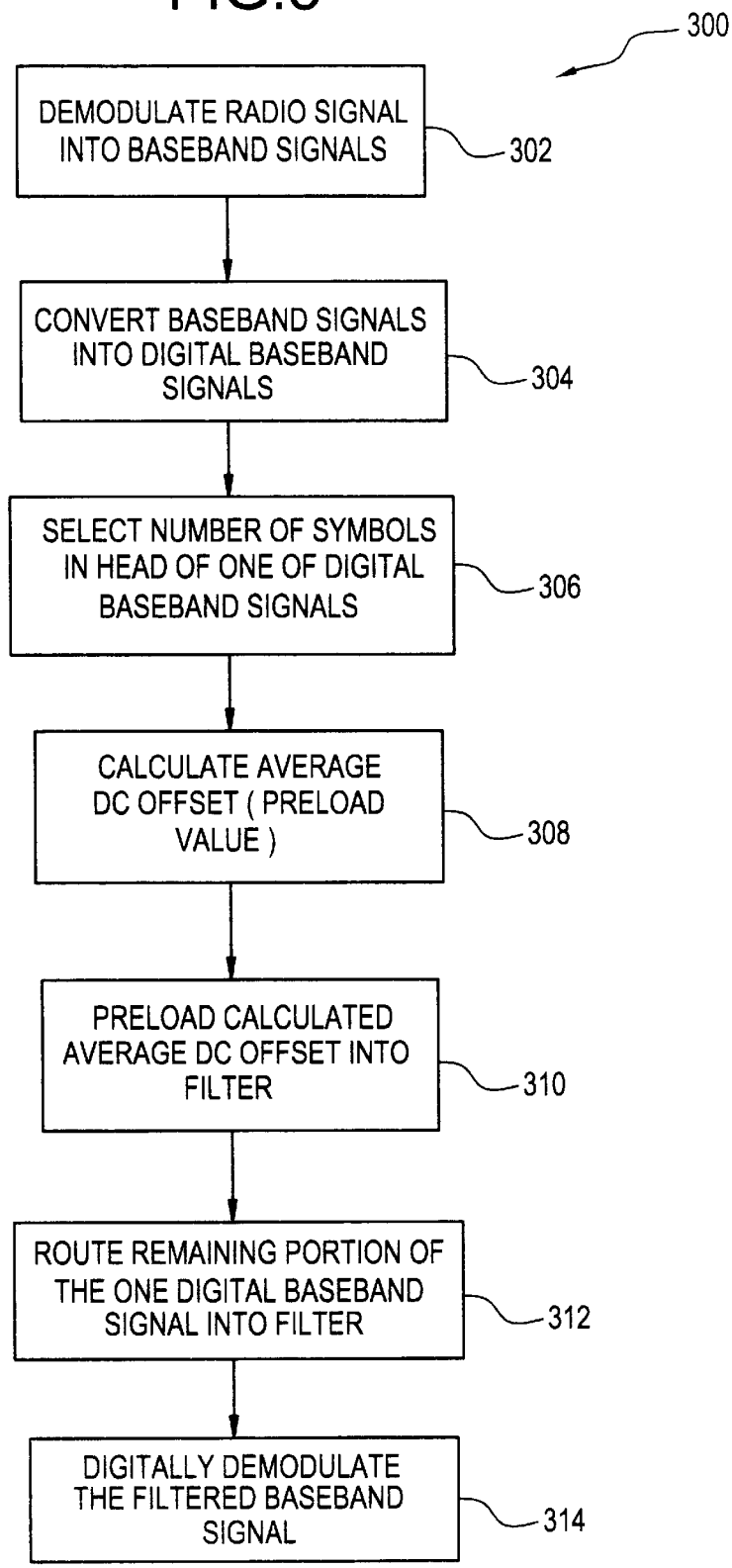
FIG. 3 is a flowchart illustrating the basic steps of a preferred method in accordance with the present invention.

Referring to FIG. 3, there is illustrated the basic steps of the preferred method 300 in accordance with the present invention. The preferred method 300 and radio receiver 200 are preferably used in a time division multiple access (TDMA) communications system where a radio signal is periodically received during a predetermined timeslot. The TDMA communications system can be based upon standards or specifications including, for example, the Global System for Mobile Communications (GSM) specification, Personal Communication System (PCS) standard and Digital Communication System (DCS) standard.

Beginning at step 302, the received radio signal is demodulated into the baseband I signal 226 and the baseband Q signal 228. At step 304, the baseband I signal 226 and the baseband Q signal 228 are respectively converted into the digital baseband I signal 236 and the digital baseband Q signal 238 by A/D converters 234. Again, for clarity, only the first preloading system 240 is described from this point since the second preloading system 242 Q has the same architecture and functionality when compared to the first preloading system 240.

At step 306, the counter 244 of the first preloading system 240 is set to allow the predetermined number of symbols located in a head portion of the digital baseband I signal 236 to be directed towards the processor 248 instead of the channel filter 250. Again, the predetermined number of symbols can be set to any number depending on the needed suppression of the transient signal caused by the undesirable DC offset. The transient signal should be suppressed because it would otherwise be dominant when compared to the received radio signal. For example, the transient signal could be as much as 50 dB higher than the received radio signal in a dual band homodyne radio receiver.

At step 308, the processor 248 operates to calculate the average DC offset using the predetermined number of symbols of the digital baseband I signal 236. The average DC offset could also be referred to as a pre-load value.

At step 310, the processor 248 operates to preload the calculated average DC offset into the channel filter 250 before the counter 244 directs the switch 246 to route the remaining digital baseband I signal 238 into the channel filter. More specifically, the internal states of the channel filter 250 are set equal to the mean DC offset value so as to effectively reduce the transient settling time within the channel filter.

At step 312, the counter 244 directs the switch 246 to route the remaining digital baseband I signal 238 through the channel filter 250. Lastly, the filtered digital baseband I signal 238 is digitally demodulated by the digital demodulator 252, at step 314.

Figure 4:
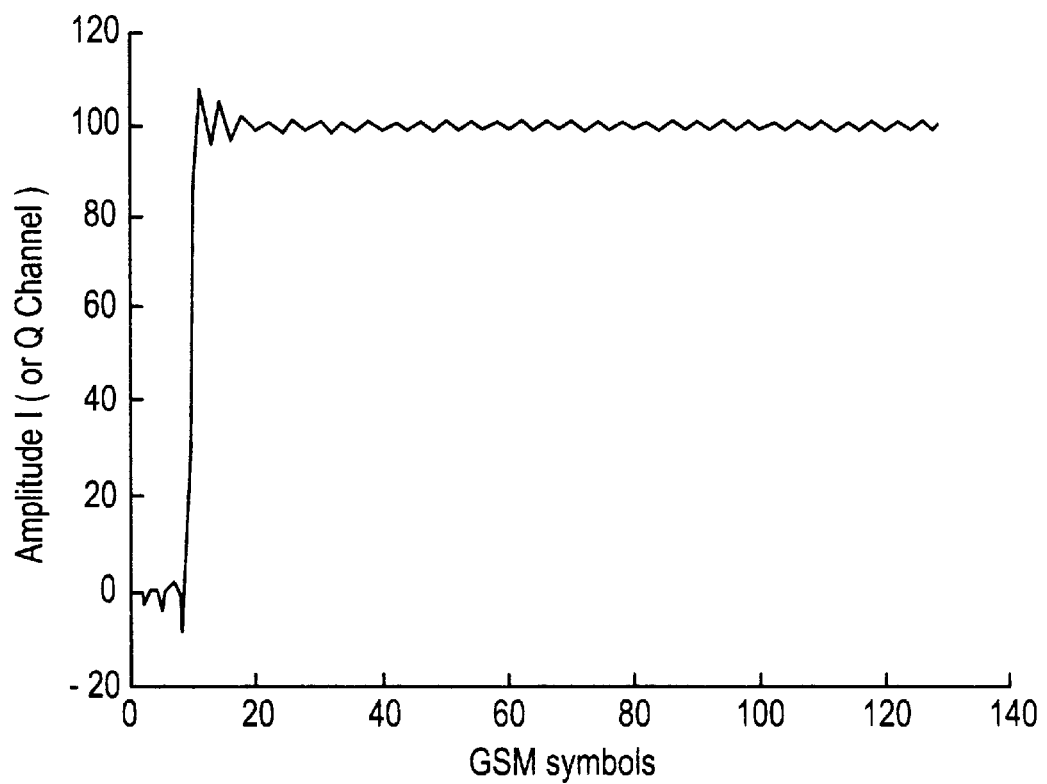
FIG. 4 is a graph indicating an output signal of the radio receiver of FIG. 2 when the filter is not preloaded with the average DC offset.

Referring to FIG. 4, there is a graph indicating an output of the radio receiver 200 (e.g., GSM radio receiver) when the channel filter 250 is not preloaded with the calculated average DC offset.

Figure 5:
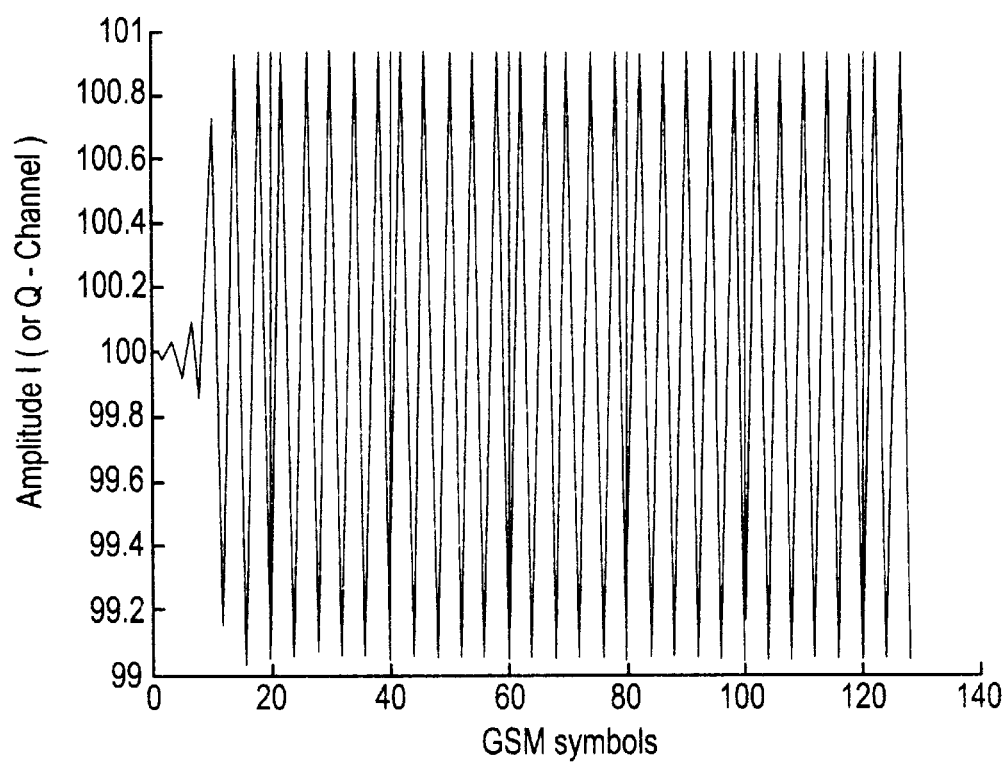
FIG. 5 is a graph indicating the output signal of the radio receiver of FIG. 2 when the filter is preloaded with the average DC offset.

Referring to FIG. 5, there is a graph indicating the output of the radio receiver 200 (e.g., GSM radio receiver) when the channel filter 250 is preloaded with the average DC offset in accordance with the present invention.

From the foregoing, it can be readily appreciated by those skilled in the art that the present invention provides a radio receiver and method that effectively compensates for an undesirable DC offset and minimizes a start-up time of a channel filter by preloading the channel filter with an average DC offset before routing a signal through the channel filter. Also, the radio receiver as disclosed effectively suppresses the interference attributable to a channel filter in an adjacent timeslot.

Although one embodiment of the method and apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A radio receiver comprising:

an antenna for receiving a radio signal;

an analog section, coupled to said antenna, for demodulating the radio signal into at least one baseband signal;

an analog-to-digital section, coupled to said analog section, for converting the at least one baseband signal into at least one digital baseband signal, respectively;

a filter for filtering the at least one digital baseband signal;

a preloading system, coupled to said analog-to-digital section and said filter, for using a predetermined number of symbols from the at least one digital baseband signal to calculate an average DC offset thereof and preloading said filter with the calculated average DC offset prior to filtering the at least one digital baseband signal in said filter; and a counter for selectively controlling a switch to direct the predetermined number of symbols from the at least one digital baseband signal to a processor operable to calculate the average DC offset, said processor operable to preload the filter with the calculated average DC offset prior to the counter selectively controlling the switch to direct the remaining at least one digital baseband signal to the filter.

2. The radio receiver of claim 1, further comprising a demodulator, coupled to said preloading system, for demodulating the at least one filtered digital baseband signal.

3. The radio receiver of claim 1, wherein said analog section further includes:

a first local oscillator;

a first mixer, coupled to said first local oscillator, for demodulating the radio signal into an intermediate frequency signal;

a second local oscillator;

a second mixer and a third mixer, coupled to said second oscillator, for demodulating the intermediate frequency signal into the at least one baseband signal including a baseband inphase (I) signal and a baseband quadrature (Q) signal, respectively.

4. The radio receiver of claim 3, wherein said radio receiver is a heterodyne receiver.

5. The radio receiver of claim 1, wherein said analog section further includes a mixer, coupled to a local oscillator, for demodulating the radio signal into the at least one baseband signal including a baseband inphase (I) signal and a baseband quadrature (Q) signal.

6. The radio receiver of claim 5, wherein said radio receiver is a homodyne receiver.

7. The radio receiver of claim 1, wherein said radio signal is periodically received during a predetermined time slot of a frame in a time division multiple access communications system.

8. The radio receiver of claim 1, wherein said radio receiver is a communications terminal.

9. The radio receiver of claim 1, wherein said filter further includes a digital channel filter.

10. A communications terminal, comprising:

an antenna for receiving a radio signal;

an analog section, coupled to said antenna, for demodulating the radio signal into baseband inphase (I) signal and a baseband quadrature (Q) signal;

an analog-to-digital section, coupled to said analog section, for converting the baseband I signal and the baseband Q signal into a digital baseband I signal and a digital baseband Q signal, respectively;

a first channel filter and a second channel filter for filtering the digital baseband I signal and the digital baseband Q signal, respectively;

a first preloading system, coupled to said analog-to-digital section and said first channel filter, for using a predetermined number of symbols from the digital baseband I signal to calculate a first average DC offset thereof and preloading said first channel filter with the calculated first average DC offset prior to filtering the digital baseband I signal in the first channel filter;

a first counter for selectively controlling a first switch to direct the predetermined number of symbols from the digital baseband I signal to a processor in said first preloading system operable to calculate the first average DC offset, said processor operable to preload the first channel filter with the calculated first average DC offset prior to the first counter selectively controlling the first switch to direct the remaining digital baseband I signal to the first channel filter;

a second preloading system, coupled to said analog-to-digital section and said second channel filter, for using a predetermined number of symbols from the digital baseband Q signal to calculate a second average DC offset and preloading said second channel filter with the calculated second average DC offset prior to filtering the digital baseband Q signal in the second channel filter; and a second counter for selectively controlling a second switch to direct the predetermined number of symbols from the digital baseband Q signal to a processor in said second preloading system operable to calculate the second average DC offset, said processor in said second preloading system operable to preload the second channel filter with the calculated second average DC offset prior to the second counter selectively controlling the second switch to direct the remaining digital baseband Q signal to the second channel filter.

11. The communications terminal of claim 10, further comprising a digital demodulator, coupled to said first and second preloading systems, for digitally demodulating the filtered digital baseband I signal and the filtered digital baseband Q signal.

12. The communications terminal of claim 10, wherein said communications terminal is a selected one of a homodyne receiver and a heterodyne receiver.

13. The communications terminal of claim 10, wherein said radio signal is periodically received during a predetermined time slot of a frame in a time division multiple access communications system.

14. A method for compensating for an undesirable DC offset within a radio receiver, said method comprising the steps of:

demodulating a radio signal into a baseband inphase (I) signal and a baseband quadrature (Q) signal;

converting the baseband I signal and the baseband Q signal into a digital baseband I signal and a digital baseband Q signal, respectively;

obtaining a predetermined number of symbols from the digital baseband I signal;

estimating a first average DC offset using the predetermined number of symbols obtained from the digital baseband I signal;

preloading a first filter with the estimated first average DC offset; and filtering, in response to preloading said first filter, the remaining digital baseband I signal in the first filter.

15. The method of claim 14 further comprising the steps of:

estimating a second average DC offset using a predetermined number of symbols from the digital baseband Q signal;

preloading a second filter with the estimated second average DC offset;

filtering, in response to preloading said second filter, the digital baseband Q signal in the second filter.

16. The method of claim 15, further comprising the step of digitally demodulating the filtered digital baseband I signal and the filtered digital baseband Q signal.

17. The method of claim 14, wherein said step of demodulating further includes demodulating the radio signal into an intermediate frequency signal, and demodulating the intermediate frequency signal into the baseband I signal and the baseband Q signal.

18. The method of claim 14, wherein said radio receiver is a selected one of a heterodyne receiver and a homodyne receiver.

19. A method for compensating for an undesirable DC offset within a radio receiver, said method comprising the steps of:

demodulating a radio signal into a baseband inphase (I) signal and a baseband quadrature (Q) signal;

converting the baseband I signal and the baseband Q signal into a digital baseband I signal and a digital baseband Q signal, respectively;

estimating a first average DC offset using a predetermined number of symbols from the digital baseband I signal;

preloading a filter with the estimated first average DC offset in a manner to reduce a transient settling time of the filter; and filtering the digital baseeband I signal in the filter using the preloaded estimated average DC offset.

20. The method of claim 19, further comprising the steps of:

estimating a second average DC offset using a predetermined number of symbols from the digital baseband Q signal;

preloading a second filter with the estimated second average DC offset in a manner to reduce a transient settling time of the second filter;

filtering the digital baseband Q signal in the second filter using the preloaded estimated second average DC offset.

21. The method of claim 20, further comprising the step of digitally demodulating the filtered digital baseband I signal and the filtered digital baseband Q signal.

22. The method of claim 19, wherein said step of demodulating further includes demodulating the radio signal into an intermediate frequency signal, and demodulating the intermediate frequency signal into the baseband I signal and the baseband Q signal.

23. The method of claim 19, wherein said radio receiver is a selected one of a heterodyne receiver and a homodyne receiver.

* * * * *

UNITED STATES PATENT AND TRADEMARK OFFICE
CERTIFICATE OF CORRECTION

PATENT NO. : 6,757,340 B1
DATED : June 29, 2004
INVENTOR(S) : Peter Jacobsson

It is certified that error appears in the above-identified patent and that said Letters Patent is hereby corrected as shown below:

Column 1,
Line 63, replace "reactively" with -- respectively --

Signed and Sealed this

Second Day of August, 2005

JON W. DUDAS
*Director of the United States Patent and Trademark Office*